(12) United States Patent
Deng

(10) Patent No.: US 12,295,106 B2
(45) Date of Patent: May 6, 2025

(54) METHOD OF PRODUCING CIRCUITS OF SUBSTRATE OF DISPLAY DEVICE

(71) Applicant: TCL CHINA STAR OPTOELECTRONICS TECHNOLOGY CO., LTD., Guangdong (CN)

(72) Inventor: Tong Deng, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/618,487

(22) PCT Filed: Nov. 5, 2021

(86) PCT No.: PCT/CN2021/128842
§ 371 (c)(1),
(2) Date: Dec. 12, 2021

(87) PCT Pub. No.: WO2023/065406
PCT Pub. Date: Apr. 27, 2023

(65) Prior Publication Data
US 2024/0015891 A1 Jan. 11, 2024

(30) Foreign Application Priority Data
Oct. 19, 2021 (CN) .......................... 202111214038.5

(51) Int. Cl.
*H05K 3/10* (2006.01)
*H05K 1/02* (2006.01)
(Continued)

(52) U.S. Cl.
CPC .............. *H05K 3/108* (2013.01); *H05K 1/028* (2013.01); *H05K 3/125* (2013.01); *H05K 3/1283* (2013.01);
(Continued)

(58) Field of Classification Search
CPC ...... H05K 3/108; H05K 3/125; H05K 3/1283; H05K 3/303; H05K 2201/10128;
(Continued)

(56) References Cited

U.S. PATENT DOCUMENTS 8,739,399 B2 * 6/2014 Cok ........................ H05K 3/125
29/830
9,270,267 B2 * 2/2016 Kim ................... H03K 17/9618
(Continued)

FOREIGN PATENT DOCUMENTS

| CN | 101686599 A | 3/2010 |
| CN | 104711512 A | 6/2015 |

(Continued)

OTHER PUBLICATIONS

Chinese Office Action issued in corresponding Chinese Patent Application No. 202111214038.5 dated May 30, 2022, pp. 1-6.
(Continued)

*Primary Examiner* — Donghai D Nguyen
(74) *Attorney, Agent, or Firm* — PV IP PC; Wei Te Chung

(57) ABSTRACT

A method of manufacturing circuits of a substrate of a display device is provided. The method includes aligning and attaching a mask with multiple slots to a circuit area of the substrate; printing a printing material in the slots of the mask using an inkjet printing technology, so that the printing material is attached to the circuit area; removing the mask from the substrate; and curing the printing material on the circuit area to form a plurality of the circuits.

16 Claims, 4 Drawing Sheets

(51) Int. Cl.
    *H05K 3/12* (2006.01)
    *H05K 3/30* (2006.01)
(52) U.S. Cl.
    CPC ... *H05K 3/303* (2013.01); *H05K 2201/10128* (2013.01); *H05K 2203/0186* (2013.01); *H05K 2203/0264* (2013.01); *H05K 2203/0502* (2013.01)
(58) Field of Classification Search
    CPC ... H05K 2203/0186; H05K 2203/0264; H05K 2203/0502; H10K 71/611; H10K 71/135; Y10T 29/49155; Y10T 29/49163
    See application file for complete search history.

(56) References Cited

U.S. PATENT DOCUMENTS

| | | | |
|---|---|---|---|
| 10,045,573 B2* | 8/2018 | Maxey | H05K 3/0067 |
| 2003/0203101 A1 | 10/2003 | Haubrich et al. | |
| 2017/0006701 A1* | 1/2017 | Casasanta, III | H05K 3/125 |

FOREIGN PATENT DOCUMENTS

| CN | 105722330 A | 6/2016 |
|---|---|---|
| CN | 108183179 A | 6/2018 |
| CN | 108447891 A | 8/2018 |
| CN | 111416205 A | 7/2020 |
| CN | 113427921 A | 9/2021 |
| JP | H04129292 A | 4/1992 |
| JP | 2004247516 A | 9/2004 |
| JP | 2006330711 A | 12/2006 |
| JP | 2015112832 A | 6/2015 |
| TW | 201023003 A | 6/2010 |

OTHER PUBLICATIONS

International Search Report in International application No. PCT/CN2021/128842, mailed on Jun. 23, 2022.
Written Opinion of the International Searching Authority in International application No. PCT/CN2021/128842, mailed on Jun. 23, 2022.
Chinese Office Action issued in corresponding Chinese Patent Application No. 202111214038.5 dated Nov. 1, 2022, pp. 1-4.
Chinese Decision of Rejection issued in corresponding Chinese Patent Application No. 202111214038.5 dated Jan. 19, 2023, pp. 1-4.
Japanese Office Action issued in corresponding Japanese Patent Application No. 特願2021-566569 dated Nov. 28, 2023, pp. 1-3.

* cited by examiner

METHOD OF PRODUCING CIRCUITS OF SUBSTRATE OF DISPLAY DEVICE

BACKGROUND OF INVENTION

1. Field of Invention

The present invention relates to a technical field of displays, and more particularly to a method for testing whether a display panel glass has cracks and a display panel.

2. Related Art

With development of display technologies, in order to maximize display ranges of display panels, demands for high screen-to-body ratios and narrow bezels is increasing. In order to achieve a method of back bonding, it is necessary to bond chips or other components on the back of substrates, and conduct on the front and back of the substrates. Therefore, a side-printing process for circuit production has emerged. Traditional side-printing processes can be divided into two types: one is the embossing method, and the other is the laser engraving method. However, it is difficult to improve precision of the circuit produced by molding, and a yield rate is low; uniformity of films formed on the substrate by the laser engraving method is not well controlled. In addition, metal splashes and oxidation problems caused by laser engraving directly performed on the substrate are difficult to solve, and underlying film layers are easily damaged.

SUMMARY OF INVENTION

An object of the present invention is to provide a method of producing circuits of a substrate of a display device to solve a problem of metal splashes occurred in traditional methods of producing circuits in peripheral areas of substrates.

To overcome the above-mentioned problem, the present application provides technical solutions as follows:

The embodiment of the present application provides a method of producing circuits of a substrate of a display device, the substrate including an upper surface, a lower surface, a side surface connected between the upper surface and the lower surface, and at least a display area and a circuit area located on the upper surface, and the method of producing the circuits including aligning and attaching a mask with multiple slots to the circuit area of the substrate; printing a printing material in the slots of the mask using an inkjet printing technology, so that the printing material is attached to the circuit area; removing the mask from the substrate; and curing the printing material on the circuit area to form a plurality of the circuits.

Further, prior to the step of aligning and attaching the mask with multiple slots to the circuit area of the substrate, the method of producing the circuits further includes using a laser engraving technology to engrave a circuit pattern on the mask, and make the circuit pattern penetrate the mask to form the multiple slots.

Further, the step of aligning and attaching the mask with the multiple slots to the circuit area of the substrate further includes aligning the mask to the circuit area of the substrate, and applying pressure on at least two sides of the mask to make the mask attach to a surface of the substrate in the circuit area.

Further, the step of removing the mask from the substrate includes: releasing the pressure applied to the mask to make the mask separate from the substrate.

Further, the circuit area is located adjacent to a periphery of the display area and extends from the upper surface to the side surface, and the mask is made of a flexible material and is at least attached to a part of the circuit area on the upper surface and a part of the circuit area on the side surface.

Further, the step of aligning and attaching the mask with the multiple slots to the circuit area of the substrate comprises: using a bending device to bend the mask so that an inner surface of the mask is correspondingly attached to the circuit area of the substrate on the upper surface and the side surface.

Further, the circuit area further extends from the side surface to the lower surface, and the mask is further attached to a part of the circuit area on the lower surface; and the step of aligning and attaching the mask slots to the circuit area of the substrate further includes: using the bending device to bend the mask so that the inner surface of the mask is correspondingly attached to the circuit area of the substrate on the upper surface and the side surface.

Further, the step of curing the printing material on the circuit area to form the plurality of includes: baking the printing material in the circuit area of the substrate to cure the printing material to form the circuits.

Further, a width of at least one of the slots of the mask is greater than or equal to 10 microns, and each of the slots has a same depth.

Further, the mask is made of epoxy resin or steel mesh.

The present application further provides a method of producing circuits of a substrate of a display device, the substrate including an upper surface, a lower surface, a side surface connected between the upper surface and the lower surface, at least a display area located on the upper surface and a circuit area located adjacent to a periphery of the display area, wherein the side surface is a vertical surface, an oblique surface, or a curved surface, and the method of producing the circuits including: aligning and attaching a mask with multiple slots to the circuit area of the substrate; printing a printing material in the slots of the mask using an inkjet printing technology, so that the printing material is attached to the circuit area; removing the mask from the substrate; and curing the printing material on the circuit area to form a plurality of the circuits.

BRIEF DESCRIPTION OF DRAWINGS

In order to more clearly illustrate the technical solutions in the embodiments or in the prior art, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

The present application provides a method of producing circuits of a substrate of a display device. The substrate can be used as a driving substrate of a liquid crystal display device or an organic light-emitting display device. Specifically, the substrate of the present application can be provided with thin-film transistors to control the display of the display unit, and the thin-film transistors are arranged in an array. Like conventional thin-film transistor array substrates, the substrate of the present application is also provided with various traces, such as data lines and scan lines, etc., and the traces are connected to corresponding chips.

Figure 1:
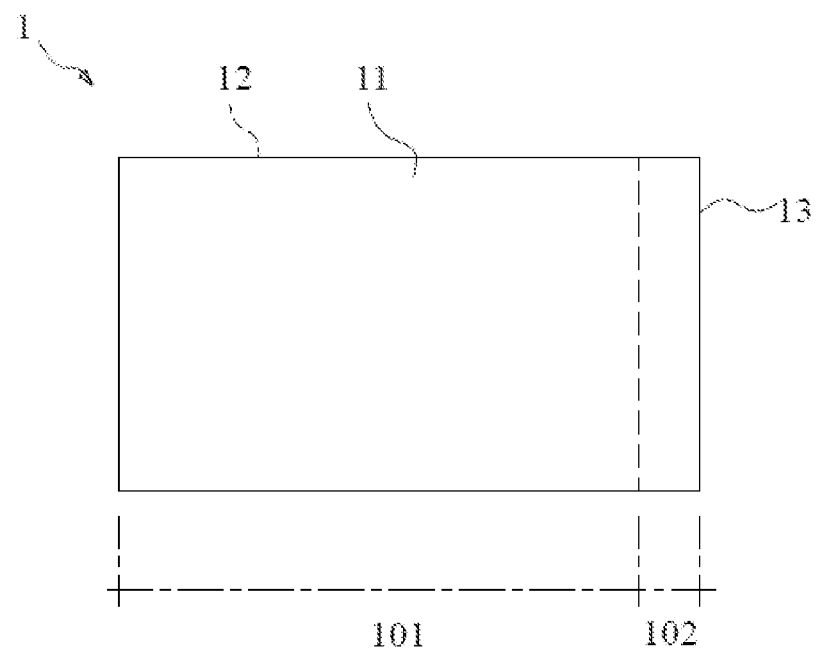
FIG. 1 is a schematic structural view of a substrate of a display device in an embodiment of the present application.

Please refer to FIG. 1, which is a schematic structural view of a substrate of a display device in an embodiment of the present application. As shown in FIG. 1, the substrate 1 of the present application includes an upper surface 11, a lower surface 12, and a side surface 13 connected between the upper surface 11 and the lower surface 12, and a display area 101 and a circuit area 102 are at least defined on the upper surface 11 of the substrate 1, wherein the display area 101 can be provided with pixel units for light emission. It should be noted that the side surface 13 of the substrate 1 may be a vertical surface, an inclined surface, or an arc surface, and it may be determined according to actual requirements. In this embodiment, the circuit area 102 is located adjacent to the display area 101 and in a peripheral area of the substrate 1, and a width of the circuit area 102 can be less than 0.3 millimeter (mm) to meet requirements of narrow frame design. It should be noted that, in the embodiment of the present application, a chip (not shown) for controlling display or controlling touch is disposed on the lower surface 12 (i.e., a rear surface) of the substrate 1 to save wiring space and further increase a range of the display area 101.

Figure 2:
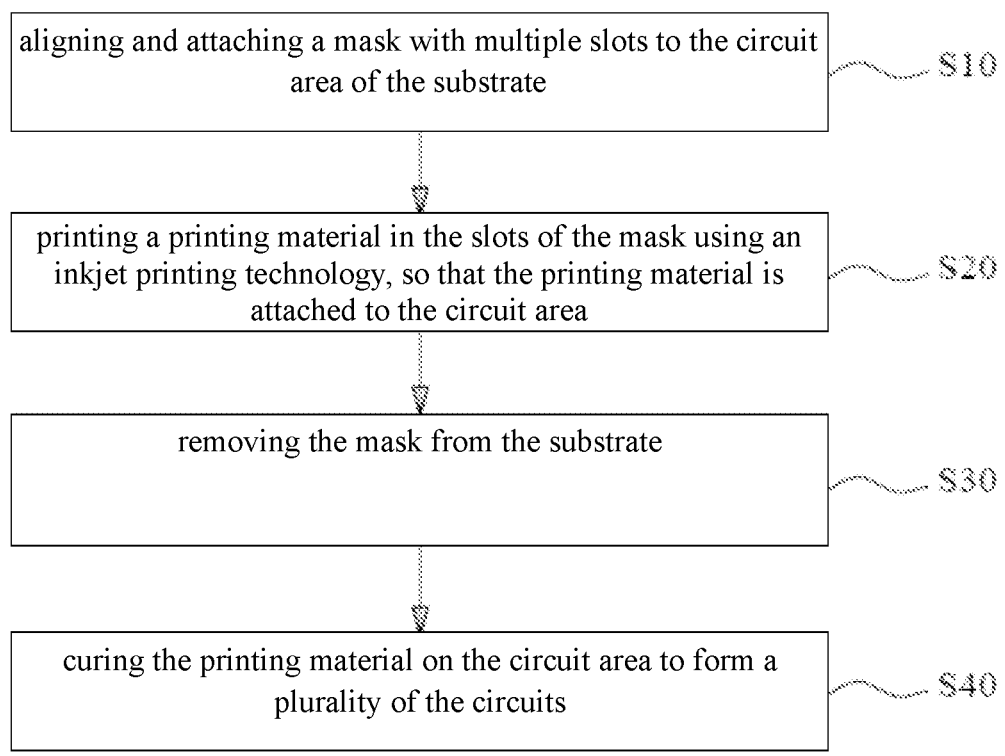
FIG. 2 is a flowchart of a method of producing circuits of a substrate of a display device in an embodiment of the present application.
Figure 3:
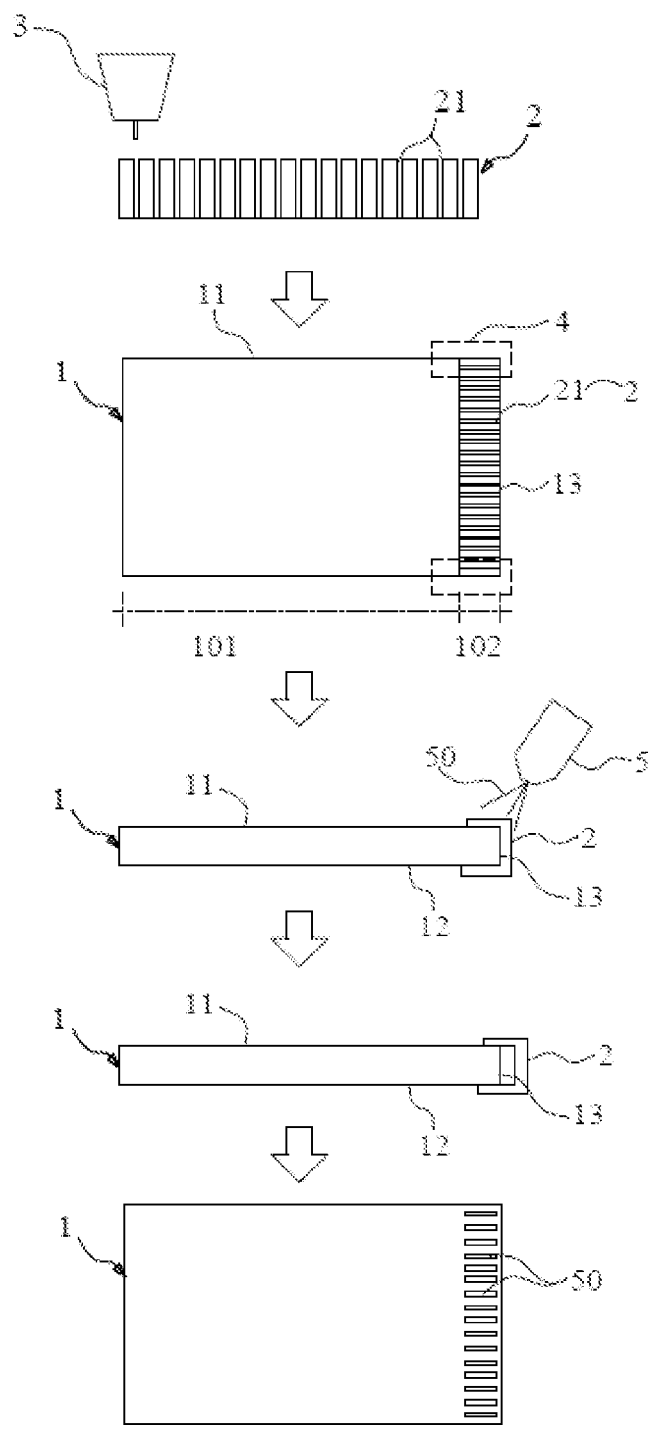
FIG. 3 is a schematic view showing the method of producing the circuits of the substrate of FIG. 2.

Please refer to FIGS. 2 and 3. FIG. 2 is a flowchart of a method of producing the circuits of the substrate 1 of the display device in an embodiment of the present application. FIG. 3 is a schematic view showing the method of producing the circuits of the substrate of FIG. 2. As shown in FIG. 2, the method of manufacturing the circuits of the substrate of the display device includes steps S10 to S40.

Step S10: positioning and attaching a mask with multiple slots to the circuit area of the substrate. As shown in FIG. 3, aligning a mask 2 with the circuit area 102 of the substrate 1, and applying pressure on at least two sides of the mask 2 to make the mask 2 attach to a surface of the substrate 1 in the circuit area 102. Specifically, a bending device (not shown) is used, such as a device for bending a chip-on-film (COF), to bend the mask 2, so that an inner surface of the mask 2 is attached to the circuit area 102 of the upper surface 11, the side surface 13, and the lower surface 1 inner surface 2 of the substrate 1 correspondingly. In the embodiment of the present application, the circuit area 102 extends from the upper surface 11 of the substrate 1 to the side surface 13 and the lower surface 12. That is, the mask 2 is bent twice by the bending device to form a configuration corresponding to the circuit area 102 of the substrate 1. Next, a fixing device 4 is used to clamp opposite sides of the mask 2 to the substrate 1 to correspond the slots 21 of the mask 2 to a predetermined position of the circuit area 102. Through the above method, a part of the mask 2 is attached to the upper surface 11 of the substrate 1 in the circuit area 102, and the other part is attached to the side surface 13 and the lower surface 12 of the substrate 1, respectively.

It should be noted that in the process of aligning and attaching, the slots 21 of the mask 2 of the present application are precisely corresponding to the position of the circuit area 102 through an alignment process, and the fixing device 4 is used to press the mask 2 without the need to use additional adhesive materials to achieve alignment.

In addition, prior to proceeding to step S10, the method of producing the circuits of this application further includes: forming a plurality of slots on the mask, and the plurality of slots penetrate the mask. Specifically, as shown in FIG. 3, the mask 2 is made of a flexible material, such as epoxy resin or steel mesh to facilitate bending and bonding, and a laser machine 3 is used to engrave a required circuit pattern on the mask 2 with the laser engraving technology, so that the circuit pattern penetrate the mask 2 to form a plurality of the slots 21. This application uses laser engraving the mask, which will not cause burns or jagged marks on edges of the slots after the patterned slots are formed. Not only can quickly carry out patterning and form the slots, but also the accuracy of the etching can be improved.

Figure 4:
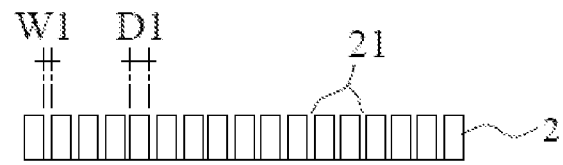
FIG. 4 is a schematic side view of the substrate with a mask in an embodiment of the application.

In the embodiment of the present application, the circuit area 102 is arranged in the peripheral area of the substrate 1 and extends from the upper surface 11 of the substrate 1 to the lower surface 12 along the side surface 13. That is, the size of the mask 2 of the present application is determined according to the range of the circuit area 102. Specifically, the mask 2 of the present application is prepared by forming a sheet-shaped mask 1 made of epoxy resin film or steel mesh on a flat surface, and the range of the mask 2 covering the circuit area 102 is greater than or equal to an area of the circuit area 102. Since the mask 2 is formed with slots 21 by the laser engraving technology, each of the slots 21 can be guaranteed to have a same depth, and the width of the slot 21 and a distance between adjacent ones of the slots 21 can be guaranteed to meet a predetermined value. In addition, in this embodiment, as shown in FIG. 4, the slots 21 formed by the laser engraving technology can realize a width W1 of each slot 21 to a narrow width of 10 microns, and a minimum distance D1 between adjacent ones of the slots 21 can also reach 10 microns, so that more lines can be arranged in the wiring area 102 of the substrate 1 to meet the requirements of today's high-density line layout.

Step S20: print a printing material in the slots of the mask using an inkjet printing technology, so that the printing material is attached to the circuit area; Specifically, as shown in FIG. 3, an inkjet printer 5 is used to print a printing material 50 in the slots 21 of the mask 2, wherein the printing material 50 is silver paste, but it is not limited thereto. In another embodiment, the printing material 50 may be copper paste. It should be noted that the printing material is preferably a material with good conductivity and adhesion.

Before printing, the printing material is prepared to have a suitable viscosity to facilitate adhesion, and a control unit (not shown) is used to set a printing speed and a printing path of the inkjet printer 5 and other parameters. During the printing process, the inkjet printer 5 is printing in a predetermined printing path. After the printing is completed, the printing material 50 completely fills the slots 21 of the mask 2, and is attached to a surface of the substrate 1 corresponding to the slots 21, as well as being flush with an outer surface of the mask 2.

Step S30: removing the mask from the substrate. Specifically, as shown in FIG. 3, after the inkjet printer 5 completes the inkjet printing, the pressure applied to the mask 2 is released, so that the mask 2 is separated from the substrate 1. That is, the fixing device 4 used to fix the mask 2 and apply pressure is removed from the mask 2 so that the mask 2 is broken away naturally. Not only the process is easy, but the demolding is fast, and there is no need for additional processing of adhesive materials, so that damage to the substrate can be prevented.

Step S40: curing the printing material on the circuit area to form the plurality of the circuits. Specifically, as shown in FIG. 3, the printing material 50 on the circuit area 102 of the substrate 1 is baked to cure the printing material 50 to form the circuits. In this embodiment, the baking is to cure the printing material 50 under a specified temperature condition, thereby a plurality of lines are formed on the circuit area 102 of the substrate 1 according to the circuit pattern of the mask 2.

Through the above steps, the method of producing the circuits of the substrate used in the display device in the embodiment of the present application is completed. That is, the method of manufacturing the circuits of the substrate according to the embodiments of the present application is a method of producing side printed circuits in the peripheral area of the substrate. After the circuits are completed, a chip can be bonded to a bonding position on the lower surface 12 of the substrate 1 through adhesion or other bonding processes, and is electrically connected to the circuits in the circuit area 102 of the present application, so as to achieve the purpose of back binding.

Figure 5:
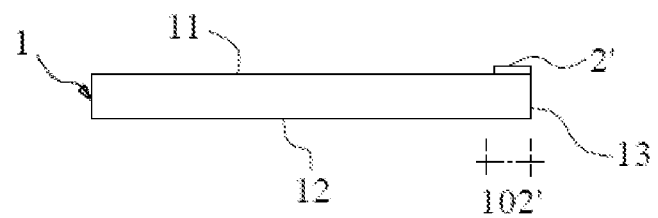
FIG. 5 is a schematic side view showing the substrate and the mask aligned and attached together in another embodiment of the present application.

Please refer to FIG. 5, which is a schematic side view showing the substrate and the mask aligned and attached together in another embodiment of the present application. A difference between the embodiment shown in FIG. 5 and the above-mentioned embodiment lies in that a mask 2' of FIG. 5 is only aligned and attached to a circuit area 102' of the upper surface 11 of the substrate 1, and other descriptions the same as the foregoing embodiment will not be repeated here. Specifically, the circuit area 102' of the substrate 1 in FIG. 5 is only defined on the upper surface 11 of the substrate 1, and does not extend to the side surface 13 and the lower surface 12 of the substrate 1. Since the mask 2' of FIG. 5 is structured to correspond to an area of the circuit area 102', the mask 2' only has a configuration corresponding to the circuit area 102' of the upper surface 11 of the substrate 1, and does not include a configuration corresponding to the circuit area 102' of the side surface 13 and the lower surface 12. In doing so, the method of producing the circuits of the substrate in the embodiment shown in FIG. 5 can achieve the same effect as that of the other embodiments described above.

Figure 6:
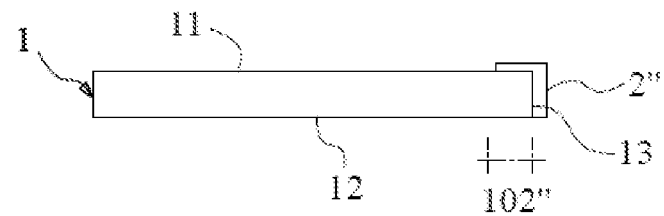
FIG. 6 is a schematic side view showing the substrate and the mask aligned and attached together in another embodiment of the present application.

Please refer to FIG. 6, which is a schematic side view showing the substrate and the mask aligned and attached together in another embodiment of the present application. A difference between the embodiment shown in FIG. 6 and the above-mentioned embodiment lies in that a mask 2" of FIG. 6 is only aligned and attached to a circuit area 102" of the upper surface 11 and the side surface 13 of the substrate 1, and other descriptions the same as the foregoing embodiment will not be repeated here. Specifically, the circuit area 102" of the substrate 1 in FIG. 6 is only defined on the upper surface 11 and the side surface of the substrate 1 and does not extend to the lower surface 12 of the substrate 1. Since the mask 2" of FIG. 6 is structured to correspond to the circuit area 102", the mask 2" only has a configuration corresponding to the circuit area 102' of the upper surface 11 and the side surface 13 of the substrate 1, and does not include a configuration corresponding to the circuit area 102" of the lower surface 12. In doing so, the method of producing the circuits of the substrate in the embodiment shown in FIG. 6 can achieve the same effect as that of the other embodiments described above.

Accordingly, based on the method of producing the circuits of the substrate of the display device provided by the present application, the mask with the circuit pattern is prepared first by laser engraving, then the mask is aligned with the circuit area (i.e., a peripheral area) of the substrate, and after the alignment, an inkjet printing process is carried out, so that the printing material is filled in the slots of the circuit pattern of the mask. Finally, the mask is removed and the printing material is cured to complete circuit production, thereby efficiency and precision of circuit production can be improved, a yield can be increased, and uniformity of the circuits can be improved, so that problems that the limited accuracy of circuit production caused by traditional molding methods, laser engraving methods or other methods, metal splashes, damage to the substrate, and complicated process can be effectively solved.

In the above-mentioned embodiments, the description of each embodiment has its own emphasis. For parts that are not described in detail in an embodiment, reference may be made to related descriptions of other embodiments.

The above describes the embodiments of the present application in detail. The descriptions of the above embodiments are only used to help understand the technical solutions and kernel ideas of the present disclosure; those of ordinary skill in the art should understand that they can still modify the technical solutions described in the foregoing embodiments, whereas these modifications or substitutions do not deviate the essence of the corresponding technical solutions from the scope of the technical solutions of the embodiments of the present disclosure.

What is claimed is:

1. A method of producing circuits of a substrate of a display device, the substrate comprising an upper surface, a lower surface, a side surface connected between the upper surface and the lower surface, at least a display area and a circuit area located on the upper surface, and the circuit area is located adjacent to a periphery of the display area and extends from the upper surface to the side surface, and the method of producing the circuits comprising:

aligning and attaching a mask with multiple slots to the circuit area of the substrate, wherein the mask is made of a flexible material and is at least configured to be attached to a part of the circuit area on the upper surface and another part of the circuit area on the side surface, and the aligning and attaching the mask with the multiple slots to the circuit area of the substrate comprises using a bending device to bend the mask so that an inner surface of the mask is correspondingly attached to the circuit area of the substrate on the upper surface and the side surface;

printing a printing material in the slots of the mask using an inkjet printing technology, so that the printing material is attached to the circuit area;

removing the mask from the substrate; and curing the printing material on the circuit area to form a plurality of the circuits.

2. The method of producing the circuits of the substrate of the display device of claim 1, wherein prior to the step of aligning and attaching the mask with multiple slots to the circuit area of the substrate, the method of producing the circuits further comprises:

using a laser engraving technology to engrave a circuit pattern on the mask, and make the circuit pattern penetrate the mask to form the multiple slots.

3. The method of producing the circuits of the substrate of the display device of claim 1, wherein the step of aligning and attaching the mask with the multiple slots to the circuit area of the substrate further comprises:

aligning the mask to the circuit area of the substrate, and applying pressure on at least two sides of the mask to make the mask attach to a surface of the substrate in the circuit area.

4. The method of producing the circuits of the substrate of the display device of claim 3, wherein the step of removing the mask from the substrate comprises:

releasing the pressure applied to the mask to make the mask separate from the substrate.

5. The method of producing the circuits of the substrate of the display device of claim 1, wherein the circuit area further extends from the side surface to the lower surface, and the mask is further attached to a part of the circuit area on the lower surface; and the step of aligning and attaching the mask slots to the circuit area of the substrate further comprises:

using the bending device to bend the mask so that the inner surface of the mask is correspondingly attached to the circuit area of the substrate on the upper surface and the side surface.

6. The method of producing the circuits of the substrate of the display device of claim 1, wherein the step of curing the printing material on the circuit area to form the plurality of to form the plurality of circuits comprises:

baking the printing material in the circuit area of the substrate to cure the printing material to form the circuits.

7. The method of producing the circuits of the substrate of the display device of claim 1, wherein a width of at least one of the slots of the mask is greater than or equal to 10 microns, and each of the slots has a same depth.

8. The method of producing the circuits of the substrate of the display device of claim 1, wherein the mask is made of epoxy resin or steel mesh.

9. A method of producing circuits of a substrate of a display device, the substrate comprising an upper surface, a lower surface, a side surface connected between the upper surface and the lower surface, at least a display area located on the upper surface and a circuit area located adjacent to a periphery of the display area, and the circuit area is located adjacent to a periphery of the display area and extends from the upper surface to the side surface, wherein the side surface is a vertical surface, an oblique surface, or a curved surface, and the method of producing the circuits comprising:

aligning and attaching a mask with multiple slots to the circuit area of the substrate, wherein the mask is made of a flexible material and is at least configured to be attached to a part of the circuit area on the upper surface and another part of the circuit area on the side surface, and the aligning and attaching the mask with the multiple slots to the circuit area of the substrate comprises using a bending device to bend the mask so that an inner surface of the mask is correspondingly attached to the circuit area of the substrate on the upper surface and the side surface;

printing a printing material in the slots of the mask using an inkjet printing technology, so that the printing material is attached to the circuit area;

removing the mask from the substrate; and curing the printing material on the circuit area to form a plurality of the circuits.

10. The method of producing the circuits of the substrate of the display device of claim 9, wherein prior to the step of aligning and attaching the mask with multiple slots to the circuit area of the substrate, the method of producing the circuits further comprises:

using a laser engraving technology to engrave a circuit pattern on the mask, and make the circuit pattern penetrate the mask to form the multiple slots.

11. The method of producing the circuits of the substrate of the display device of claim 9, wherein the step of aligning and attaching the mask with the multiple slots to the circuit area of the substrate further comprises:

aligning the mask to the circuit area of the substrate, and applying pressure on at least two sides of the mask to make the mask attach to a surface of the substrate in the circuit area.

12. The method of producing the circuits of the substrate of the display device of claim 11, wherein the step of removing the mask from the substrate comprises:

releasing the pressure applied to the mask to make the mask separate from the substrate.

13. The method of producing the circuits of the substrate of the display device of claim 9, wherein the circuit area further extends from the side surface to the lower surface, and the mask is further attached to a part of the circuit area on the lower surface; and the step of aligning and attaching the mask slots to the circuit area of the substrate further comprises:

using the bending device to bend the mask so that the inner surface of the mask is correspondingly attached to the circuit area of the substrate on the upper surface and the side surface.

14. The method of producing the circuits of the substrate of the display device of claim 9, wherein the step of curing the printing material on the circuit area to form the plurality of the circuits comprises:

baking the printing material in the circuit area of the substrate to cure the printing material to form the circuits.

15. The method of producing the circuits of the substrate of the display device of claim 9, wherein a width of at least one of the slots of the mask is greater than or equal to 10 microns, and each of the slots has a same depth.

16. The method of producing the circuits of the substrate of the display device of claim 9, wherein the mask is made of epoxy resin or steel mesh.

\* \* \* \* \*